United States Patent [19]

Van Husen

[11] Patent Number: 4,514,687
[45] Date of Patent: Apr. 30, 1985

[54] HALL EFFECT DEVICE TEST CIRCUIT

[75] Inventor: Hendrik W. Van Husen, Glen Ellyn, Ill.

[73] Assignee: GTE Automatic Electric Incorporated, Northlake, Ill.

[21] Appl. No.: 396,177

[22] Filed: Jul. 7, 1982

[51] Int. Cl.³ ............... G01R 31/00; G01R 33/12
[52] U.S. Cl. ..................... 324/158 R; 324/202; 324/228
[58] Field of Search ............ 324/158 R, 158 D, 202, 324/228, 74; 307/309

[56] References Cited

U.S. PATENT DOCUMENTS

| 3,621,334 | 11/1971 | Burns et al. | 307/309 |
| 4,084,135 | 4/1978 | Enabnit | 324/202 |
| 4,156,191 | 5/1979 | Knight et al. | 324/202 |
| 4,190,799 | 2/1980 | Miller et al. | 324/158 D |
| 4,230,987 | 10/1980 | Mordwinkin | 324/228 |
| 4,270,087 | 5/1981 | Littwin | 324/228 |

Primary Examiner—Ernest F. Karlsen
Attorney, Agent, or Firm—Robert J. Black; Gregory G. Hendricks

[57] ABSTRACT

A test circuit which detects Hall effect device operate and release time failures. This circuit includes a magnetic field circuit, a comparison circuit, a storage circuit and a visual indication circuit. The magnetic field circuit causes a Hall effect device under test to periodically switch states. The operate and release times of such switching is compared to predetermined thresholds by the comparison circuit. Switching times within the allowable thresholds cause the storage circuit to operate the visual indication circuit.

15 Claims, 1 Drawing Figure

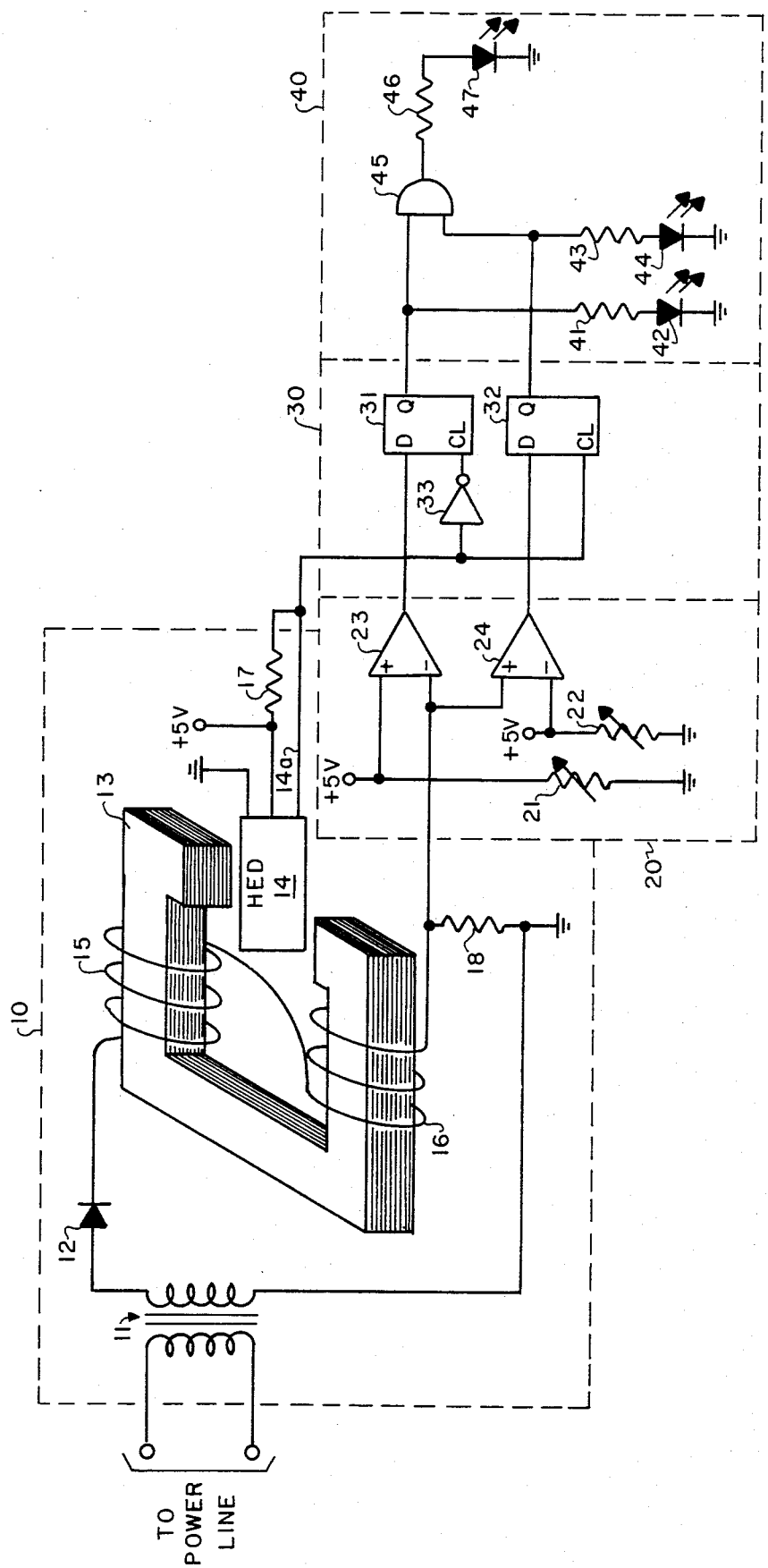

HALL EFFECT DEVICE TEST CIRCUIT

FIELD OF THE INVENTION

The present invention relates to test circuitry and more particularly to a Hall effect device test circuit.

BACKGROUND OF THE INVENTION

Circuitry related to Hall effect devices and other magnetic field circuitry has been developed for a variety of purposes. U.S. Pat. No. 4,156,191, issued to Knight, et al. on May 22, 1979, discloses an apparatus for adjusting the magnetic coupling between a Hall effect device and an operating magnet. U.S. Pat. No. 4,190,799, issued to Miller, et al. on Feb. 26, 1980, discloses a method for measuring the magnitude and sign of the Hall angle of the material of a wafer. U.S. Pat. No. 4,270,087, issued to A. K. Littwin on May 26, 1981, discloses an apparatus for testing permanent magnets using electromagnets and Hall sensors. U.S. Pat. No. 4,084,135, issued to R. S. Enabnit on Apr. 11, 1978, discloses a system and method for checking the sensitivity and performance of an electromagnetic field variation detector. And, U.S. Pat. No. 4,230,987, issued to G. Mordwinkin on Oct. 28, 1980, discloses a digital eddy current apparatus for generating metallurgical signatures and monitoring metallurgical contents of an electrically conductive material.

While the circuits disclosed in these patents are related to magnetic field or Hall effect devices, none of these patents discloses a method for monitoring the tolerance of the operate and release levels of a Hall effect device.

A circuit which does test the operate and release times of a Hall effect device is the subject of a U.S. patent application also titled, "Hall Effect Device Test Circuit". That application was filed in the U.S. patent office on Aug. 30, 1982, and was assigned Ser. No. 412,758. The circuit disclosed in that application utilizes a novel arrangement of relays and retriggerable monstable multivibrators, rather than the integrated circuit arrangement of the present invention.

Accordingly, it is the object of the present invention to provide a novel test circuit to monitor the operate and release levels of a Hall effect device. Features of the present invention include high reliability, minimum complexity and visual indications of tolerable operate and release levels.

SUMMARY OF THE INVENTION

The present invention is a circuit which detects out-of-tolerance operate and release times of a Hall effect device under test. This circuit includes a power signal source which provides an alternating current signal. A magnetic field circuit includes a diode which converts this alternating current signal to a half-wave signal and applies it to an electromagnet which produces a periodic magnetic field of varying intensity. A sample voltage resistor provides a voltage having a magnitude corresponding to the intensity of the magnetic flux. The Hall effect device operates and releases in response to each application of magnetic flux. A first comparator provides a below-threshold signal when the sample voltage is below a first predetermined threshold and a second comparator provides an above-threshold signal when the sample voltage is above a second predetermined threshold. A first D-type flip-flop is triggered when the Hall effect device operates and if the below-threshold signal is present it causes a first light emitting diode to operate, thereby indicating a valid operate time. A second D-type flip-flop is triggered when the Hall effect device releases and if the above-threshold signal is present, it causes a second light emitting diode to operate thereby indicating a valid release time.

DESCRIPTION OF THE DRAWING

The single FIGURE of the accompanying drawing is a schematic diagram of a Hall effect device test circuit in accordance with the present invention.

DESCRIPTION OF THE PREFERRED EMBODIMENT

Referring now to the accompanying drawing, the Hall effect device test circuit of the present invention is shown. Comparison circuit 20 and storage circuit 30 are both connected to magnetic field circuit 10 which is further connected to a power line. Comparison circuit 20 is also connected to storage circuit 30 which is further connected to visual indication circuit 40.

Magnetic field circuit 10 periodically provides an increasing and decreasing magnetic field which causes a Hall effect device under test to periodically turn on and off. The comparison circuit constantly compares a sample voltage corresponding to the intensity of the magnetic field to predetermined thresholds. If the operate or release thresholds have not been exceeded when the Hall effect device switches a corresponding visual indication is provided to indicate such normal switching behavior.

Magnetic field circuit 10 includes coils 15 and 16 wound on electromagnet 13. These coils are connected to the power line via diode 12, transformer 11 and sample voltage resistor 18. Hall effect device 14 is connected in magnetic field proximity to electromagnet 13 and it is electrically connected to storage circuit 30.

Comparison circuit 20 includes operational amplifiers 23 and 24 each having positive and negative inputs. Sample voltage resistor 18 is connected to both the negative input of amplifier 23 and the positive input of amplifier 24. Potentiometer 21 is connected to the positive input of amplifier 23 and potentiometer 22 is connected to the negative input of amplifier 24.

Storage circuit 30 includes D-type flip-flops, 31 and 32, and inverter 33. Hall effect device 14 is connected directly to the clock input of flip-flop 32 while it is connected via inverter 33 to the clock input of flip-flop 31. The D input of flip-flops 31 and 32 is connected to the output of amplifiers 23 and 24, respectively. Indication circuit 40 includes light emitting diodes 42 and 44, and their associated resistors 41 and 43, respectively. These resistors are connected to the Q output of flip-flops 31 and 32, respectively and they are also connected to AND gate 45 which is further connected to light emitting diode 47 via resistor 46.

Transformer 11 steps the voltage from the power line down to a usable level. Diode 12 ensures that only half-wave current flows from the secondary winding of transformer 11 through coils 15 and 16. After this current flows through coils 15 and 16 it develops a sample voltage across resistor 18 which is representative of the current flowing through coils 15 and 16 and therefore it is also representative of the intensity of the magnetic flux in the gap of electromagnet 13.

The alternating current flowing in the primary winding of transformer 11 has a sine wave format. The half-wave current flowing through coils 15 and 16 is represented by a half-wave portion of a sine wave. Therefore the intensity of the magnetic flux in the gap of electromagnet 13 also varies according to a half-wave portion of a sine wave. Such a variable intensity magnetic flux can be described as periodic bursts of magnetic flux which increase and decrease in intensity according to a half-wave portion of a sine wave. Thus Hall effect device 14 is periodically exposed to bursts of magnetic flux which increase over time to a maximum level and then dissipate.

Since Hall effect device 14 operates and releases in response to predetermined thresholds of magnetic flux it will periodically turn on in response to a first predetermined level of magnetic flux and then turn off as the magnetic flux decreases to a second predetermined level. When Hall effect device 14 turns on it provides a logic level 0 signal at lead 14a and when turns off it produces a logic level 1 signal on this lead. Therefore, Hall effect device 14 periodically produces alternating logic level 0 and 1 signals at lead 14a since it periodically turns on and off with the rising and falling magnetic flux signals appearing in the gap of electromagnet 13.

Sample voltage resistor 18 is chosen to provide a voltage proportional to the intensity of the magnetic flux in the gap of electromagnet 13. For instance this resistor can be chosen to provide a 0.5 volt level when the magnetic flux in the gap of electromagnet 13 reaches a 500 gauss level.

Comparators 23 and 24 compare the voltage developed across sample voltage resistor 18 to predetermined threshold voltages. Comparator 23 provides a logic level 1 signal when the sample voltage developed across resistor 18 is less than the predetermined threshold voltage level applied to the positive input of this comparator. Such threshold voltage equals a sample voltage corresponding to a flux density in the gap of electromagnet 13 which is the maximum allowable flux at which Hall effect device 14 should operate. Comparator 24 operates similarly, but its function is to determine whether the Hall effect device release time is proper. This comparator provides a logic level 1 signal when the sample voltage developed across resistor 18 is greater than the predetermined threshold voltage applied to its negative input. This threshold voltage equals a sample voltage corresponding to a flux density which is the minimum allowable flux at which Hall effect device 14 should release.

Therefore comparator 23 produces a logic level 1 signal as long as the maximum operate flux density has not been exceeded and comparator 24 produces a logic level 1 signal as long as the minimum release flux density is exceeded.

When Hall effect device 14 operates it provides a logic level 0 signal on lead 14a which is inverted to a logic level 1 signal by inverter 33. This logic level 1 signal appears at the clock input of D-type flip-flop 31. Since this flip-flop is a positive edge triggered flip-flop, as soon as Hall effect device 14 operates, it causes D-type flip-flop 31 to be clocked. Therefore the data appearing at its D input is transferred to its Q output. Since comparator 23 is connected to the D input of flip-flop 31, when Hall effect device 14 operates, the signal from comparator 23 is transferred to the Q output of D-type flip-flop 31.

If Hall effect device 14 operates properly, it operates before the maximum allowable threshold voltage is reached and therefore comparator 23 will be providing a logic level 1 signal on its output. Consequently, a logic level 1 signal appears on the Q output of flip-flop 31. This signal causes light emitting diode 42 to turn on, thereby providing a visual indication that Hall effect device 14 operates in response to less than the maximum allowable intensity of magnetic flux.

If such maximum flux threshold is exceeded, comparator 23 provides a logic level 0 signal on its output. If this logic level 0 signal is present when Hall effect device 14 operates, such logic level 0 signal is transferred to the Q output of flip-flop 31. This signal keeps light emitting diode 42 turned off, thereby indicating that Hall effect device 14 requires more than the maximum allowable magnetic flux to operate.

When Hall effect device 14 releases it provides a logic level 1 signal on lead 14a. This logic level 1 signal appears at the clock input of D-type flip-flop 32. Since this flip-flop is also positive edge triggered, as soon as Hall effect device 14 releases it causes flip-flop 32 to be clocked. Since comparator 24 is connected to the D input of flip-flop 32, when Hall effect device 14 releases, the signal from comparator 24 is transferred to the Q output of this flip-flop.

If Hall effect device 14 releases properly it releases before the minimum allowable threshold voltage is reached and therefore comparator 24 will be providing a logic level 1 signal on its output. Consequently a logic level 1 signal appears on the Q output of flip-flop 32. This signal causes light emitting diode 42 to turn on, thereby providing a visual indication that Hall effect device 14 releases in response to more than the minimum allowable intensity of magnetic flux.

If such minimum flux threshold is not exceeded, comparator 24 provides a logic level 0 signal on its output. If this logic level 0 signal is present when Hall effect device 14 releases, such logic level 0 signal is transferred to the Q output of flip-flop 32. This signal keeps light emitting diode 44 turned off, thereby indicating that Hall effect device 14 requires less than the minimum allowable magnetic flux to release.

If Hall effect device 14 operates and releases properly then light emitting diode 47 lights since under these conditions logic level 1 signals from both flip-flops 31 and 32 appear at the inputs to gate 45 which then causes light emitting diode 47 to operate.

The Hall effect device test circuit of the present invention thus compares the operate and release levels of a Hall effect device under test to predetermined the thresholds of magnetic flux which correspond to the maximum allowable operating flux and the minimum allowable release flux. Visual displays also indicate the proper operate and release functions of the Hall effect device.

It will be obvious to those skilled in the art that numerous modifications of the present invention can be made without departing from the spirit of the invention which shall be limited only by the scope of the claims appended hereto.

What is claimed is:

1. A Hall effect device test circuit for use in a test system including a power signal source, said test circuit comprising:

magnetic field means connected to said power signal source, operated in response to said power signal to periodically provide a magnetic field of varying intensity;

voltage reference means connected to said power source, operated in response to said power signal to periodically provide a sample voltage of varying magnitude and proportional to the intensity of said magnetic field;

a Hall effect device connected in magnetic field proximity to said magnetic field means, operated in response to each magnetic field of a first predetermined intensity to provide an operate signal, and operated in response to each magnetic field of a second predetermined intensity to provide a release signal;

comparison means connected to said voltage reference means operated in response to said sample voltage having a magnitude less than a first predetermined threshold to provide a first comparison signal and further operated in response to said sample voltage having a magnitude greater than a second predetermined threshold to provide a second comparison signal;

storage means connected to said comparison means and said Hall effect device, operated in response to each operate signal and said first comparison signal to provide a first storage signal and further operated in response to each release signal and said second comparison signal to provide a second storage signal; and signaling means connected to said storage means, operated in response to said first storage signal to provide a first status signal and further operated in response to said second storage signal to provide a second status signal.

2. A Hall effect device test circuit as claimed in claim 1, wherein: said signaling means is further operated in response to said first and second storage signals to provide a third status signal.

3. A Hall effect device test circuit as claimed in claim 1, wherein: said storage means is further operated in response to each operate signal and an absence of said first comparison signal to inhibit said first storage signal and further operated in response to each release signal and an absence of said second comparison signal to inhibit said second storage signal.

4. A Hall effect device test circuit as claimed in claim 1, wherein said magnetic field means comprises:
an electromagnet connected to a diode, whereby said magnetic field is unidirectional.

5. A Hall effect device test circuit as claimed in claim 1, wherein said voltage reference means comprises:
a resistor.

6. A Hall effect device test circuit as claimed in claim 1, wherein there is further included first and second threshold determining means, said comparison means comprising:

a first comparator including a first input connected to said first threshold determining means and a second input connected to said voltage reference means; and a second comparator including a first input connected to said voltage reference means and a second input connected to said second threshold determining means, whereby said first comparator provides said first comparison signal and said second comparator provides said second comparison signal.

7. A Hall effect device test circuit as claimed in claim 1, wherein said storage means comprises:
a first D-type flip-flop having a data input connected to said comparison means and a clock input connected to said Hall effect device;
an inverter connected to said Hall effect device; and
a second D-type flip-flop having a data input connected to said comparison means and a clock input connected to said inverter.

8. A Hall effect device test circuit as claimed in claim 1, wherein said signaling means comprises:
a first visual indicator operated to provide said first status signal.

9. A Hall effect device test circuit as claimed in claim 1, wherein said signaling means further comprises:
a second visual indicator operated to provide said second status signal.

10. A Hall effect device test circuit as claimed in claim 2, wherein said signaling means further comprises:
a third visual indicator operated to provide said third status signal.

11. A Hall effect device test circuit as claimed in claim 8, wherein said first visual signaling means comprises:
a light emitting diode.

12. A Hall effect device test circuit as claimed in claim 9, wherein said second visual signaling means comprises:
a light emitting diode.

13. A Hall effect device test circuit as claimed in claim 10, wherein said third visual signaling means comprises:
a light emitting diode.

14. A Hall effect device test circuit as claimed in claim 6, wherein: said first and second threshold determining means each comprise a potentiometer.

15. A Hall effect device test circuit as claimed in claim 7, wherein: said data input of said first D-type flip-flop is connected to said first comparator and said data input of said second D-type flip-flop is connected to said second comparator.

* * * * *